(12) United States Patent
Sethumadhavan et al.

(10) Patent No.: US 7,022,404 B2
(45) Date of Patent: Apr. 4, 2006

(54) CIRCUIT SUBSTRATE MATERIAL, CIRCUITS COMPRISING THE SAME, AND METHOD OF MANUFACTURE THEREOF

(75) Inventors: Murali Sethumadhavan, Shrewsbury, MA (US); Vincent R. Landi, Phoenix, AZ (US); Bruce G. Kosa, Woodstock, CT (US)

(73) Assignee: World Properties, Inc., Lincolnwood, IL (US)

( * ) Notice: Subject to any disclaimer, the term of this patent is extended or adjusted under 35 U.S.C. 154(b) by 0 days.

(21) Appl. No.: 10/700,343

(22) Filed: Nov. 3, 2003

(65) Prior Publication Data

US 2004/0166305 A1    Aug. 26, 2004

Related U.S. Application Data

(60) Provisional application No. 60/423,281, filed on Nov. 1, 2002.

(51) Int. Cl.
   *B32B 3/00* (2006.01)
   *H05K 1/00* (2006.01)
(52) U.S. Cl. ............... 428/295.1; 428/209; 428/425.8; 428/425.9; 428/465; 174/258
(58) Field of Classification Search ............... 428/209, 428/901, 295.1, 425.8, 425.9, 465; 174/258
   See application file for complete search history.

(56) References Cited

U.S. PATENT DOCUMENTS

| | | | | |
|---|---|---|---|---|
| 5,139,875 | A | * | 8/1992 | Metzemacher et al. ...... 428/403 |
| 5,223,568 | A | | 6/1993 | Landi et al. ................. 524/571 |
| 5,416,143 | A | * | 5/1995 | El Sayed et al. ............ 524/116 |
| 5,571,609 | A | | 11/1996 | St. Lawrence et al. ...... 428/268 |
| 5,972,811 | A | | 10/1999 | St. Lawrence et al. ...... 442/237 |
| 6,048,807 | A | | 4/2000 | Landi .......................... 442/237 |
| 6,476,138 | B1 | * | 11/2002 | Sato et al. ................... 525/191 |
| 6,528,559 | B1 | * | 3/2003 | Nakacho et al. ............ 524/116 |

* cited by examiner

*Primary Examiner*—Cathy F. Lam
(74) *Attorney, Agent, or Firm*—Cantor Colburn LLP

(57) ABSTRACT

An electrical circuit material having a conductive layer disposed a substrate, wherein the substrate is formed from a thermosetting composition comprising a polybutadiene or polyisoprene resin; an optional, functionalized liquid polybutadiene or polyisoprene resin; an optional butadiene- or isoprene-containing copolymer; an optional low molecular weight polymer; an optional curing agent; a cross-linking agent; a particulate fluoropolymer; and about 20 to about 50 percent by weight, based on the total weight of the thermosetting composition, of a magnesium hydroxide having a low ionic content. Use of magnesium hydroxide allows the composition to attain a high level of flame retardancy without use of halogenated flame retardants, while maintaining good moisture absorption and other physical properties.

23 Claims, 1 Drawing Sheet

CIRCUIT SUBSTRATE MATERIAL, CIRCUITS COMPRISING THE SAME, AND METHOD OF MANUFACTURE THEREOF

CROSS REFERENCE TO RELATED APPLICATIONS

This application claims the benefits of U.S. Provisional Patent Application Ser. No. 60/423,281 filed Nov. 1, 2002, which is fully incorporated herein by reference.

BACKGROUND

This disclosure relates generally to a method of making thermosetting compositions for use in electrical circuit materials and the resulting products, and in particular to thermosetting polybutadiene and polyisoprene circuit substrate materials.

As used herein, a circuit material is an article used in the manufacture of circuits and multi-layer circuits, and includes circuit laminates, bond plies, resin coated conductive layers, and cover films. Circuit laminates, bond plies, resin coated conductive layers, and cover films in turn are formed from dielectric materials that can comprise a thermosetting or thermoplastic polymer. The dielectric material in a bond ply, resin covered conductive layer, or cover film may comprise a substantially non-flowable dielectric material, i.e., one that softens or flows during manufacture but not use of the circuit, whereas the dielectric material in a circuit laminate (e.g., a dielectric substrate) is designed to not soften or flow during manufacture or use of the circuit or multi-layer circuit. Dielectric substrate materials are further typically divided into two classes, flexible and rigid. Flexible dielectric substrate materials generally tend to be thinner and more bendable than the so-called rigid dielectric materials, which typically comprise a fibrous web or other forms of reinforcement, such as short or long fibers or fillers.

A circuit laminate as used herein refers to one or two conductive layers fixedly attached to a dielectric substrate, which is formed from a dielectric material. Patterning a conductive layer of a laminate, e.g., by etching, provides a circuit. Multi-layer circuits comprise a plurality of conductive layers, at least one of which contains a conductive wiring pattern. Typically, multi-layer circuits are formed by laminating one or more circuits together using bond plies, and, in some cases, resin coated conductive layers, in proper alignment using heat and/or pressure. The bond plies are used to provide adhesion between circuits and/or between a circuit and a conductive layer, or between two conductive layers. In place of a conductive layer bonded to a circuit with a bond ply, the multi-layer circuit may include a resin coated conductive layer bonded directly to the outer layer of a circuit. In such multi-layer structures, after lamination, known hole forming and plating technologies may be used to produce useful electrical pathways between conductive layers.

Polybutadiene and polyisoprene thermosetting materials have been successfully employed as rigid electrical circuit substrates. These materials have typically used halogenated, particularly brominated, flame retardant additives to achieve the necessary levels of flame retardancy. In recent years, brominated flame retardants have come under scrutiny, such that certain of them will be banned by January 2008. The remaining brominated flame retardants will require special incineration/disposal procedures. In light of the impending ban, manufacturers are placing additional pressures upon suppliers to produce flame retardant additives that are effective, yet that do not contain halogens.

The most commonly used alternative flame retardant additives are phosphorous/nitrogen compounds. However, phosphorous/nitrogen compounds possess high dielectric constants, loss factors, and moisture absorption properties. These properties are adverse to intended uses in applications such as the electronic industries, automobile industries, and particularly in circuit boards and related applications. Accordingly, there remains a need for non-halogen containing flame retardant thermosetting compositions that provide the desired flame retardant properties without impairing physical properties such as electrical and moisture absorption properties.

SUMMARY

The above discussed and other problems and deficiencies of the prior art are overcome or alleviated by a substrate for an electrical circuit material, wherein the substrate is formed from a thermosetting composition comprising a polybutadiene or polyisoprene resin; an optional, functionalized liquid polybutadiene or polyisoprene resin; an optional butadiene- or isoprene-containing copolymer; an optional low molecular weight polymer; a cross-linking agent; a particulate fluoropolymer; and about 20 to about 50 percent by weight, based on the total weight of the thermosetting composition, of a magnesium hydroxide having less than about 1000 ppm of ionic contaminants, and further wherein the substrate has a UL-94 rating of at least V-1.

In another embodiment, an electrical circuit material comprises a substrate and a layer of conductive metal disposed on the substrate, wherein the substrate is formed from a thermosetting composition comprising a polybutadiene or polyisoprene resin; an optional, functionalized liquid polybutadiene or polyisoprene resin; an optional butadiene- or isoprene-containing copolymer; an optional low molecular weight polymer; a cross-linking agent; a particulate fluoropolymer; and about 20 to about 50 percent by weight, based on the total weight of the thermosetting composition, of a magnesium hydroxide having a low ionic content, and further wherein the substrate has a UL-94 rating of at least V-1.

Use of magnesium hydroxide in the thermosetting compositions allows the substrate materials to achieve a desired flame retardancy without use of brominated flame retardants, but does not adversely affect properties such as dielectric constant or moisture absorbance. The above-discussed and other features and advantages will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DETAILED DESCRIPTION OF THE PREFERRED EMBODIMENTS

Figure 1:
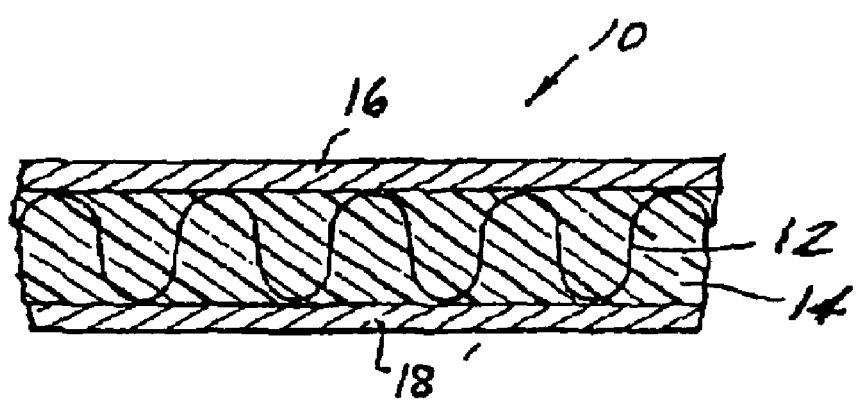
FIG. 1 is a schematic representation of a diclad circuit material containing a woven web.

A thermosetting composition having particular utility as a substrate for an electrical circuit material comprises a thermosetting polybutadiene or polyisoprene resin system; about 20 to about 50 percent by weight, based on the total weight of the composition, of magnesium hydroxide having a low ionic content; a crosslinking agent; and a particulate fluoropolymer.

Use of magnesium hydroxide as a flame retardant agent allows the circuit material to achieve the desired flame retardancy in the absence of halogenated flame retardants, particularly brominated flame retardants. Dielectric properties are also acceptable with use of magnesium hydroxide. This result is particularly surprising in view of the fact that magnesium hydroxide has a high dielectric constant and the presence of such large amounts of magnesium hydroxide would have been expected to greatly increase the dielectric constant of the composition. However, the inventors hereof have discovered that use of a particular polybutadiene or polyisoprene thermosetting composition, together with about 20 to about 50 percent by weight of a magnesium hydroxide having a low ionic content, produces a thermosetting composition exhibiting excellent flame retardancy, electrical and moisture resistance properties.

A number of commercially available magnesium hydroxides are suitable for use in the present thermosetting compositions, for example those available under the trade name MAGNIFIN® from Albemarle Corp. According to the product literature, MAGNIFIN® H5IV and MAGNIFIN® H10IV are magnesium hydroxides having a low ionic content, and are treated (coated) with an aminosilane. Low ionic content is herein defined as containing less than about 1,000 ppm, preferably less than about 500 ppm by weight of ionic contaminants such as chloride ion. In addition, it is preferred that the magnesium hydroxide has a low total metal content, herein defined as less than about 500 ppm, preferably less than about 400 ppm, more preferably less than about 300 ppm by weight of metal contaminants such as iron, aluminum, chromium, manganese, copper, and the like. It is especially preferred that the amount of iron oxide be limited to less than about 100 ppm, preferably less than about 50 ppm. Other suitable magnesium hydroxides are commercially available under the trade name MAGSHIELD from Martin Marietta Corp., ZEROGEN from J. M. Huber Engineering materials, and FR20 from Dead Sea Bromine Group.

In addition, the particulate size of the magnesium hydroxide can impact the electrical and flame retardant properties of the substrate material. Preferably the magnesium hydroxide has an average surface area (BET) of about 3 to about 12 square meters per gram, preferably about 5 to about 10, and an average particle size of about 0.1 to about 2 micrometers. The magnesium hydroxide comprises about 20 to about 50 percent by weight of the total thermosetting composition (i.e., resin system as described below, curing agent, crosslinking agent, particulate fluoropolymer, and magnesium hydroxide, but exclusive of any reinforcing glass web or filler).

The magnesium hydroxide is used in combination with a polybutadiene or polyisoprene thermosetting resin system comprising (1) a polybutadiene or polyisoprene resin; (2) an optional, functionalized liquid polybutadiene or polyisoprene resin; (3) an optional butadiene- or isoprene-containing copolymer; and (4) an optional low molecular weight polymer.

As a first component, the resin system comprises a polybutadiene resin, a polyisoprene resin, or mixture thereof. The polybutadiene or polyisoprene resins may be liquid or solid at room temperature. Liquid resins may have a molecular weight greater than about 5,000, but preferably have a molecular weight of less than about 5,000 (most preferably between about 1,000 and about 3,000). The preferably liquid (at room temperature) resin portion maintains the viscosity of the composition at a manageable level during processing to facilitate handling, and it also crosslinks during cure. Polybutadiene and polyisoprene resins having at least 90% 1,2-addition by weight are preferred because they exhibit the greatest crosslink density upon cure owing to the large number of pendant vinyl groups available for crosslinking. High crosslink densities are desirable because the products exhibit superior performance in an electrochemical cell environment at elevated temperatures. A preferred resin is B3000 resin, a low molecular weight polybutadiene liquid resin having greater than 90 weight percent (wt. %) 1,2-addition. B3000 resin is commercially available from Nippon Soda Co., Ltd.

The resin system further optionally comprises a functionalized liquid polybutadiene or polyisoprene resin. Examples of appropriate functionalities for butadiene liquid resins include but are not limited to epoxy, maleate, hydroxy, carboxyl and methacrylate. Examples of useful liquid butadiene copolymers are butadiene-co-styrene and butadiene-co-acrylonitrile. Possible functionalized liquid polybutadiene resins include Nisso G-1000, G-2000, G-3000; Nisso C-1000; Nisso BN-1010, BN-2010, BN-3010, CN-1010; Nisso TE-2000; and Nisso BF-1000 commercially available from Nippon Soda Co., Ltd. and Ricon 131/MA commercially available from Colorado Chemical Specialties, Inc.

The optional, butadiene- or isoprene-containing copolymer is preferably unsaturated and can be liquid or solid. It is preferably a solid, thermoplastic elastomer comprising a linear or graft-type block copolymer having a polybutadiene or polyisoprene block, and a thermoplastic block that preferably is styrene or α-methyl styrene. Possible block copolymers, e.g., styrene-butadiene-styrene tri-block copolymers, include Vector 8508M (commercially available from Dexco Polymers, Houston, Tex.), Sol-T-6302 (commercially available from Enichem Elastomers American, Houston, Tex.), and Finaprene 401 (commercially available from Fina Oil and Chemical Company, Dallas, Tex.). Preferably, the copolymer is a styrene-butadiene di-block copolymer, such as Kraton D1118X (commercially available from Shell Chemical Corporation). Kraton D1118X is a di-block styrene-butadiene copolymer containing 30 vol % styrene.

The butadiene- or isoprene-containing polymer may also contain a second block copolymer similar to the first except that the polybutadiene or polyisoprene block is hydrogenated, thereby forming a polyethylene block (in the case of polybutadiene) or an ethylene-propylene copolymer (in the case of polyisoprene). When used in conjunction with the first copolymer, materials with enhanced toughness can be produced. Where it is desired to use this second block copolymer, a preferred material is Kraton GX1855 (commercially available from Shell Chemical Corp.), which is believed to be a mixture of styrene-high 1,2-butadiene-styrene block copolymer and styrene-(ethylene-propylene)-styrene block copolymer.

Thus, in a preferred embodiment, the butadiene- or isoprene-containing polymer comprises a solid thermoplastic elastomer block copolymer having the formula $X_m(Y-X)_n$ (linear copolymer) or

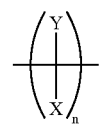

(graft copolymer), where Y is a polybutadiene or polyisoprene block, X is a thermoplastic block, and m and n represent the average block numbers in the copolymer, m is 0 or 1 and n is at least 1. The composition may further include a second thermoplastic elastomer block copolymer having the formula $W_p(Z-W)_q$ (linear copolymer) or

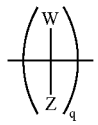

(graft copolymer) where Z is a polyethylene or ethylene-propylene copolymer block, W is a thermoplastic block, and p and q represent the average block numbers in the copolymer, p being 0 and 1 and q being at least 1.

The volume to volume ratio of the polybutadiene or polyisoprene resin to butadiene- or isoprene-containing polymer preferably is between 1:9 and 9:1, inclusive. The selection of the butadiene- or isoprene-containing polymer depends on chemical and hydrolysis resistance as well as the toughness conferred upon the molded material.

The optional low molecular weight polymer resin is generally employed to enhance toughness and other desired characteristics of composition. By low molecular weight polymer, it is meant a polymer having a molecular weight of less than about 50,000, preferably less than about 5,000. Examples of suitable low molecular weight polymer resins include, but are not limited to, telechelic polymers such as polystyrene, multifunctional acrylate monomers and ethylene propylene diene monomer (EPDM) containing varying amounts of pendant norbornene groups and/or unsaturated functional groups. The optional low molecular weight polymer resin can be present in amounts of zero to about 30 wt % of the resin system.

A curing agent may be used to accelerate the curing reaction. When the composition is heated, the curing agent decomposes to form free radicals, which then initiate cross linking of the polymeric chains. Preferred curing agents are organic peroxides such as Luperox, dicumyl peroxide, t-butyl perbenzoate, 2,5-dimethyl-2,5-di(t-butyl peroxy)hexane, α,α-bis(t-butyl peroxy)diisopropylbenzene, and 2,5-dimethyl-2,5-di(t-butyl peroxy) hexyne-3, all of which are commercially available. They may be used alone or in combination. Typical amounts of curing agent are about 1.5 wt % to about 6 wt % of the resin system.

Crosslinking agents may also be added to increase the crosslink density of the resin(s). Examples of preferred cross-linking agents include triallylisocyanurate, triallylcyanurate, diallyl phthalate, divinyl benzene, and multifunctional acrylate monomers (e.g., the Sartomer resins available from Arco Specialty Chemicals Co.), and combinations thereof, all of which are commercially available, with triallylisocyanurate being generally preferred. The cross-linking agent content of the thermosetting composition can be readily determined by one of ordinary skill in the art, depending upon the desired flame retardancy of the composition, the amount of the other constituent components, and the other properties desired in the final product. UL-94, an Underwriters Laboratories flammability test, provides four possible ratings, HB, V-2, V-1, and V-0. V-0 is the most difficult rating to obtain, requiring that five bars of material self extinguish with an average flame out time of five seconds or less without dripping. More particularly, the amount of cross-linking agent depends upon the loading of magnesium hydroxide and amount(s) of the other components in the thermosetting composition, and attaining excellent flame retardancy, electrical and moisture properties. In general, effective quantities are greater than or equal to about 0.5 wt %, preferably greater than or equal to about 1 wt %, and most preferably greater than or equal to about 5 wt % based on the total weight of the thermosetting composition. Effective quantities are typically less than about 15 wt %, preferably about 10 wt %, and most preferably about 8 wt % based on the total weight of the resin system.

Suitable particulate fluoropolymers for inclusion in the thermosetting composition include those known in the art for circuit substrates, and include but are not limited to fluorinated homopolymers, for example polytetrafluoroethylene (PTFE), and fluorinated copolymers, e.g. copolymers of tetrafluoroethylene with hexafluoropropylene or perfluoroalkylvinylethers such as perfluorooctylvinyl ether, or copolymers of tetrafluoroethylene with ethylene. Blends of fluorinated polymers, copolymers, and terpolymers formed from the above listed monomers are also suitable for use with the present invention. A particularly preferred fluoropolymer is PTFE.

Useful forms of particulate fluoropolymer resin include fine powder and granular fluoropolymer, both of which are widely commercially available. As used herein, granular and dispersion are terms of art commonly used in connection with the forms of fluoropolymers, and refers to the physical characteristics of the fluoropolymer, particularly particle size. Particle size in turn is determined by the method of fluoropolymer manufacture.

Fine powder PTFE (or coagulated dispersion) is made by coagulation and drying of dispersion-manufactured PTFE. Fine powder PTFE is generally manufactured to exhibit a particle size of approximately 400 microns to 500 microns. It is used in the manufacture of paste extruded articles, such as wire insulation and in paste extrusion and calendaring.

Granular PTFE is made by a suspension polymerization method. Granular PTFE is generally used for compression molding of PTFE articles. It is also widely used for the molding of billets that are then skived on a lathe to produce PTFE sheet. Granular PTFE is generally manufactured in two different particle size ranges. The standard product is made with a median particle size of approximately 30 microns to 40 microns. The high bulk density product exhibits a median particle size of about 400 microns to 500 microns. In addition to these forms of PTFE, other fluoropolymer compositions such as DuPont Teflon FEP and PFA are also available in pellet form. The pellets can be cryogenically ground to exhibit a median particle size of less than 100 microns (μm). It is expected that such materials, with the appropriate particle size distribution would act to achieve the same end in the present invention as granular PTFE. Accordingly, granular fluoropolymers as used herein may refer to fluoropolymers manufactured by either suspension polymerization or by cryogenic grinding of pellets to the granular form. Particularly preferred for use is a granular PTFE commercially available under the trade name Zonyl MP-1100, available from DuPont, Wilmington, Del. having a particle size on the order of 35 microns.

The optimal particulate fluoropolymer content of the thermosetting composition can be readily determined by one of ordinary skill in the art, depending upon the necessary flame retardancy of the composition, for example, based on V-0, V-1 or V-2 in UL-94, the amount of the other constituent components, and the other properties desired in the final product. More particularly, the amount of the fluoropolymer composition depends upon the loading of magnesium hydroxide and amount(s) of other synergists in the thermosetting composition, and attaining excellent flame retardancy, electrical and moisture properties. In general, effective quantities are greater than or equal to about 1 phr, preferably greater than or equal to about 5 phr, and most preferably greater than or equal to about 10 phr (parts per hundred parts by weight) of the total thermosetting resin composition. Effective quantities are typically less than or equal to about 90 phr, preferably less than or equal to about 75 phr, and most preferably less than or equal to about 50 phr of the total weight of the thermosetting composition.

Use of magnesium hydroxide as disclosed herein can eliminate the need for a halogenated flame retardant, and at the very least, allows use of advantageously low levels of such flame retardants. The thermosetting composition thus optionally comprises a halogenated flame retardant. The halogenated flame retardant can comprise less than or equal to about 900 parts per million (ppm) of a chlorine-containing flame retardant and less than or equal to about 900 ppm of a bromine-containing flame retardant, for a total halogenated flame retardant concentration of 1800 ppm, based on the resin system, preferably based on the total thermosetting composition (resin system plus magnesium hydroxide), more preferably based on the total dielectric material (resin system plus magnesium hydroxide plus particulate inorganic filler plus woven or non-woven web). A suitable bromine-containing flame retardant is ethylenebistetrabromopthalimide available as Saytex BT-93 from Albermarle Corp. A suitable chlorine-containing flame retardant is 1,4:7,10-dimethanodibenzo (a,e) cyclooctane 1,2,3,4,7,8,9,10,13,13,14,14-dodecachloro-1,4,4a,5,6,6a,7,10,10a,11,12,12a-dodecahydro, which is available as Dechlorane Plus from OxyChem.

The thermosetting composition optionally comprises a filler. Preferably, the filler material and quantity thereof is selected so as to provide the substrate with a coefficient of thermal expansion that is equal or substantially equal to the coefficient of thermal expansion of the metal layer. Suitable fillers include, for example, rutile titanium dioxide and amorphous silica because these fillers have a high and low dielectric constant, respectively, thereby permitting a broad range of dielectric constants combined with a low dissipation factor to be achieved in the final cured product by adjusting the respective amounts of the two fillers in the composition. To improve adhesion between the fillers and resin, coupling agents, e.g., silanes, can be used.

The volume percent (vol %) of the filler (based upon the combined volume of the resin system, and particulate filler) is about 5% to about 60%, preferably about 30% to about 50%. Examples of preferred fillers include titanium dioxide (rutile and anatase), barium titanate, strontium titanate, silica (particles and hollow spheres) including fused amorphous silica and fumed silica; corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina or magnesia. They may be used alone or in combination.

A very high surface area particulate filler such as fumed silica may be additionally used to prevent tackiness and stickiness in the prepreg. The preferred fumed silica is available from Degussa under the trade name AEROSIL 200, and has a surface area of about 200 $m^2/g$, with a typical primary particle size of about 12 nanometers. The amount of fumed silica used may be about 0.2 to about 5 vol %, and preferably about 0.5 to about 1.5 vol %.

The compositions optionally comprise woven, thermally stable webs of a suitable fiber, preferably glass (E, S, and D glass) or high temperature polyester fibers (e.g., KODEL from Eastman Kodak). The web is present in an amount of about 10 to about 40 vol %, and preferably about 15 to about 25 vol % with respect to the thermosetting resin composition. Such thermally stable fiber reinforcement provides the laminate with a means of controlling shrinkage upon cure within the plane of the laminate. In addition, the use of the woven web reinforcement renders a dielectric substrate with a relatively high mechanical strength. In general, the thermosetting composition is processed as follows. First, all the components (resin, magnesium hydroxide, cross-linking agent, particulate fluoropolymer and other desired additives) are thoroughly mixed in conventional mixing equipment along, preferably with a peroxide curing agent. The mixing temperature is regulated to avoid substantial decomposition of the curing agent (and thus premature cure). Mixing continues until the ingredients are uniformly dispersed throughout the resin. For those applications where the thermosetting composition is to impregnate a woven web forming a prepreg, conventional prepreg manufacturing methods can be employed. Typically the web is impregnated with the slurry, metered to the correct thickness, and then the solvent removed to form a prepreg.

The lamination process entails a stack-up of one or more saturated woven webs (or a non-saturated woven web sandwiched between two bond plies) between one or two sheets of conductive foil (copper). The stack-up is then cured (via lamination) in a one step or two step curing cycle.

The stack-up can be cured using a conventional peroxide cure step at temperatures between about 150° C. and about 200° C. The peroxide-cured stack-up may then be subjected to a high-energy electron beam irradiation cure (E-beam cure) or a high temperature cure step under an inert atmosphere to impart an unusually high degree of cross-linking to the resulting laminate. The temperature is greater than about 250° C. but less than about 400° C., or the decomposition temperature of the resin. This high temperature cure is preferably carried out in an oven but can also be performed in a press, namely as a continuation of the initial lamination step.

In the alternative, the thermosetting composition can be mixed with a solvent to form a casting composition. The casting composition is applied to a substrate. Thereafter, the solvent is removed and the cast resin system is subjected to the aforementioned cure cycle.

In one preferred embodiment, the thermosetting composition includes a plurality of woven webs (such as E-glass webs) embedded in a mixture of the polybutadiene or polyisoprene based resin system and inorganic filler (e.g., silica) laminated between one or two sheets of conductive foils (e.g., copper) to produce a circuit board material that is especially well suited for microwave applications. Of course, if very thin (e.g., less than 5 mil thickness) cross-sections are desired, then only a single saturated web may be used for the dielectric layer. Referring now to FIG. 1, a cross-sectional view of a circuit material comprising the thermosetting composition is shown generally at 10. Circuit substrate 10 has been laminated in accordance with one of the processes described above wherein a woven web 12 is embedded in a thermosetting composition as described herein 14 and laminated between two conductive layers 16, 18, for example copper foils, to produce a circuit material. As discussed above with reference to the processing conditions, the thermosetting composition 14 may either be cast onto woven web 12 using known casting equipment, or woven web 12 may be saturated by thermosetting composition 14 by sandwiching woven web 12 between a pair of bond plies formed from thermosetting composition 14 and laminating the stack up together with the conductive layers 16, 18. While FIG. 1 depicts a single layer of woven web 12, it will be appreciated that typically a plurality of layers of saturated woven web 12 will be used in forming circuit laminates. However, a single layer as shown in FIG. 1 is desirable where very thin cross-sections, e.g., less than about 5 mils, are required.

Figure 2:
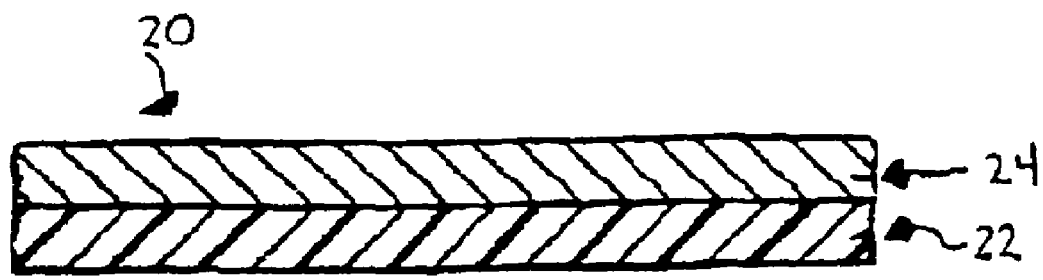
FIG. 2 is a schematic representation of a circuit material.

In FIG. 2 is shown a circuit material 20 formed from a dielectric material 22 comprising a flame retardant thermosetting polybutadiene or polyisoprene resin composition as described herein disposed on a conductive layer 24, such as copper. Any one or more of conductive layers 16, 18, or 24 may be etched by known methods to provide a circuit layer.

The thermosetting composition described above has numerous advantages. A UL-94 rating of V-1 or better may be obtained without the use of halogenated flame retardants. In addition a dielectric constant (Dk) less than about 4.5 and preferably less than about 4.0 may be obtained. The dissipation or dielectric loss factor (Df) is less than about 0.01 and preferably less than about 0.006. Finally the moisture absorption of the thermosetting composition is less than about 0.2 and preferably less than about 0.15%.

The following non-limiting examples further describe the thermosetting composition.

oughly mixed to form a slurry in conventional mixing equipment. The mixing temperature was regulated to avoid substantial decomposition of the curing agent (and thus premature cure). Next, conventional prepreg manufacturing methods were employed. Typically, if used, the web was impregnated with the slurry, metered to the correct thickness, and then the solvent was removed (evaporated) to form a prepreg. The lamination process entailed a stack-up of one or more prepreg layers between one or two sheets of conductive foil (copper). This stack-up was then densified and cured via lamination or a combination of lamination and oven baking. The stack-up was cured in a conventional peroxide cure step; typical cure temperatures were between about 330 and about 425° F. (about 165 to about 218° C.).

In the following examples, flame retardance was measured in accordance with UL-94. The designation "fail" indicates that the sample did not attain V-1.

Dielectric constant (Dk) values are the averages of the measured dielectric constants from a 1–10 Ghz frequency sweep.

Dissipation Factor (Df) values are the lowest recorded value of a given 1–10 Ghz frequency sweep.

Specific gravity ("Sp.g.") was determined in accordance with ASTM D79291.

Water absorption was measured by IPCTM-650 2.6.2.1 (with 48 hr exposure).

TABLE 1

|  | Example No. | | | | | | |
| --- | --- | --- | --- | --- | --- | --- | --- |
|  | 1* | 2* | 3* | 4 | 5 | 6 | 7** |
| Component (wt %) | | | | | | | |
| Magnesium hydroxide (Magnifin H10) | 50 |  |  |  | 20 | 25 | 20 |
| Magnesium hydroxide (Zerogen) |  | 38 | 35 | 50 |  |  |  |
| Magnesium hydroxide (Magnifin H5A) |  |  |  |  | 30 |  |  |
| Magnesium hydroxide (Magnifin H5) |  |  |  |  |  | 15 | 20 |
| Magnesium hydroxide (Magnifin H3) |  |  |  |  |  | 10 | 10 |
| Silica | 18 | 25 | 28 | 8 | 15 | 15 | 15 |
| Triallylisocyanurate |  | 5 |  | 5 | 5 | 5 | 5 |
| Particulate PTFE |  |  | 5 | 5 | 5 | 5 | 5 |
| Flame retardant (Saytex BT-93) |  |  |  |  | 0.2 | 0.2 | 0.2 |
| Flame retardant (Dechlorane plus) |  |  |  |  | 0.2 | 0.2 | 0.2 |
| Results | | | | | | | |
| UL-94 | Fail | Fail | Fail | V-1 | V-0 | V-0 | V-0 |
| Df at 3 GHz | 0.0047 | 0.0053 | 0.0054 | 0.0061 | 0.0047 | 0.0047 | 0.0047 |
| Dielectric constant |  | 3.93 | 3.93 | 4.06 | 4.01 | 3.83 | 3.94 |
| Water absorbance | 0.2 | 0.25 |  | 0.11 | 0.17 | 0.08 | 0.12 |
| Specific gravity |  |  |  |  | 1.88 | 1.88 | 1.88 |

*Denotes comparative examples
**Post cured with Perkadox

EXAMPLES

Compositions as described in U.S. Pat. No. 6,048,807, comprising a polybutadiene resin (B3000 from Nisso) and a cure agent, together with the additives as shown with Table 1, were formulated and tested. In general, the compositions were processed as follows. First, the polybutadiene resin, magnesium hydroxide, and all other components were thoroughly Comparative Example 1 has magnesium hydroxide only, Comparative Example 2 has a combination of magnesium hydroxide and triallylisocyanurate cross-linker, and Comparative Example 3 has a combination of magnesium hydroxide and polytetrafluoroethylene. All of the comparative examples failed the UL-94 test. In addition, the samples had dissipation factors less than about 0.006, dielectric constants less than about 4.5, water absorption of less than about 0.2, and xylene absorption (data not shown) of less than about 1.1.

Example 4 with magnesium hydroxide, triallylisocyanurate cross-linker, and polytetrafluoroethylene had a UL 94 rating of V-1. Thus, the combination of three additives provides a V-1 rating in the absence of additional flame retardants.

Examples 5–7 contain fire retardants in addition to the magnesium hydroxide, triallylisocyanurate cross-linker, and polytetrafluoroethylene. All three examples achieve a V-0 rating. In addition, the samples had dissipation factors less than about 0.005, dielectric constants less than about 4.1, and water absorption of less than about 0.2. Example 5 contains a combination of uncoated (Magnifin H10) and coated (Magnifin H5A) magnesium hydroxides. The coated magnesium hydroxide may be optionally used to prevent loss of magnesium hydroxide during acidic processing conditions. The different examples also contain magnesium hydroxide particles having different surface areas. Comparing Examples 5, 6 and 7, Example 5 has a combination of 10 square meters per gram surface area and 5 square meters per gram surface area sized magnesium hydroxide, while Examples 6 and 7 have a combination of 10, 5 and 3 square meters per gram surface area (Magnifin H10, H5 and H, respectively). The particle surface area may be varied when it is desirable to modify the particle packing fraction.

In summary, the data show thermosetting compositions with UL-94 ratings of V-0 and V-1, with Example 4 achieving a V-1 rating without use of additional flame retardant. In addition, dielectric constants of less than about 4.5 and even less than about 4.0 can be achieved. The dissipation factors of the compositions are less than about 0.0065. Also, the water absorption is less than about 2.5 with many samples less than 0.2. The data thus clearly show that the thermosetting compositions comprising magnesium hydroxide, PTFE, and crosslinker possess acceptable UL-94 ratings, dielectric constants, dissipation factors, and moisture absorption properties with and without the addition of halogenated flame retardants.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. An electrical circuit material comprising a conductive layer disposed a substrate, wherein the substrate is formed from a thermosetting composition comprising:
   a polybutadiene or polyisoprene resin;
   a cross-linking agent;
   a particulate fluoropolymer; and
   about 20 to about 50 percent by weight, based on the total weight of the thennosetting composition, of a magnesium hydroxide having less than about 1000 ppm of ionic contaminants; wherein the substrate has a UL-94 rating of at least V-1.

2. The electrical circuit material of claim 1, wherein the thennosetting composition further comprises a butadiene- or isoprene-containing copolymer.

3. The electrical circuit material of claim 2, wherein the butadiene- or isoprene-containing copolymer is an unsaturated butadiene- or isoprene-containing copolymer.

4. The electrical circuit material of claim 3, wherein the volume to volume ratio of the polybutadiene or polyisoprene resin to the unsaturated butadiene- or isoprene-containing copolymer is between 1:9 and 9:1, inclusive.

5. The electrical circuit material of claim 1, wherein the thermosetting composition further comprises a curing agent.

6. The electrical circuit material of claim 5, wherein the curing agent is an organic peroxide, a dicumyl peroxide, a di(2-tert-butylperoxyisopropyl) benzene, a t-butylperbenzoate, a t-butylperoxy hexyne-3, or a combination comprising one or more of the foregoing curing agents.

7. The electrical circuit material of claim 1, wherein the thermosetting composition further comprises a low molecular weight polymer.

8. The electrical circuit material of claim 1, wherein the thermosetting composition further comprises a functionalized liquid polybutadiene or polyisoprene resin.

9. The electrical circuit material of claim 1, wherein the cross-linking agent is triallylisocyanurate, triallylcyanurate, diallyl phthalate, divinyl beuzene, a multifunctional acrylate monomer, or a combination comprising one or more of the foregoing cross-linking agents.

10. The electrical circuit material of claim 1, wherein the particulate fluoropolymer is a difluoroethylene polymer, a tetrafluoroethylene polymer, a tetrafluoroethylene-hexafluoropropylene copolymer, a copolymer of tetrafluoroethylene with fluorine-free ethylenic monomers, or a combination comprising one or more of the foregoing particulate fluoropolymers.

11. The electrical circuit material of claim 1, wherein the substrate has a moisture absorption value less than about 0.2% and a UL-94 flammability rating of V-0.

12. The electrical circuit material of claim 1, wherein the substrate has a dielectric constant less than about 4.5 and a dielectric loss factor less than about 0.01.

13. The electrical circuit material of claim 1, wherein the conductive layer is copper.

14. The electrical circuit material of claim 1, wherein the thermosetting composition further comprises a woven or non-woven glass web.

15. The electrical circuit material of claim 1, wherein the magnesium hydroxide comprises less than about 500 ppm of metal.

16. The electrical circuit material of claim 1, wherein the thermosetting composition further comprises a chlorine-containing flame retardant, a bromine-containing flame retardant, or a combination comprising one or more of the foregoing flame retardants.

17. The electrical circuit material of claim 1, wherein the magnesium hydroxide has an average surface area of about 3 to about 12 meters squared per gram.

18. The electrical circuit material of claim 1, wherein the magnesium hydroxide is coated with an aminosilane.

19. The electrical circuit material of claim 1, further comprising a filler.

20. The electrical circuit material of claim 19, where the filler further comprises a coupling agent.

21. The electrical circuit material of claim 20, where the coupling agent is a silane.

22. A circuit comprising the electrical circuit material of claim 1.

23. A substrate for an electrical circuit material, wherein the substrate comprises a thermosetting composition comprising:
   a polybutadiene or polyisoprene resin;
   a cross-linking agent;
   a particulate fluoropolymer; and
   about 20 to about 50 percent by weight, based on the total weight of the thermosetting composition, of a magnesium hydroxide having less than about 1000 ppm of ionic contaminants; wherein the substrate has a UL-94 rating of at least V-1.

* * * * *